United States Patent [19]
Gabriel et al.

[11] Patent Number: 6,060,376
[45] Date of Patent: May 9, 2000

[54] INTEGRATED ETCH PROCESS FOR POLYSILICON/METAL GATE

[75] Inventors: Calvin Gabriel, Cupertino; Xi-Wei Lin; Tammy Zheng, both of Fremont; Linda Leard, San Jose; Ian Robert Harvey, Livermore, all of Calif.

[73] Assignee: VLSI Technology, Inc., San Jose, Calif.

[21] Appl. No.: 09/005,244

[22] Filed: Jan. 12, 1998

Related U.S. Application Data

[63] Continuation-in-part of application No. 08/886,170, Jun. 30, 1997.

[51] Int. Cl.$^7$ .............................................. H01L 21/3205

[52] U.S. Cl. ........................................... 438/585; 438/689

[58] Field of Search ................................... 438/585, 584, 438/689, 694, 733

[56] References Cited

U.S. PATENT DOCUMENTS 4,868,617  9/1989  Chiao et al. ........................... 357/23.3

*Primary Examiner*—Chandra Chaudhari
*Assistant Examiner*—Craig Thompson
*Attorney, Agent, or Firm*—Douglas L. Weller

[57] ABSTRACT

A gate region of a transistor is prepared for receiving a deposit of metal. A chemical mechanical polishing process is performed to reduce thickness of an insulation layer above the gate region. At the end of the chemical mechanical polishing process, a portion of the insulating layer remains above the gate region. An etch process is performed to remove the portion of the insulating layer remaining above the gate region. The etch process also removes a portion of polysilicon within the gate region and removes a top portion of spacers on either side of the gate region. A polysilicon selective etch-back is performed to remove an additional portion of the polysilicon within the gate region.

17 Claims, 5 Drawing Sheets

INTEGRATED ETCH PROCESS FOR POLYSILICON/METAL GATE

CROSS REFERENCE TO RELATED APPLICATION

This application is a continuation-in-part of application Ser. No. 08/886,170, filed Jun. 30, 1997, by Xi-Wei Lin for SELF-ALIGNED PROCESSING OF SEMICONDUCTOR DEVICE FEATURES.

BACKGROUND

The present invention concerns the processing of semiconductor devices and pertains particularly to an integrated etch process for polysilicon/metal gate.

Polysilicon is often the material of choice for the gates of field effect transistors formed on an integrated circuit because of the stability of polysilicon and the compatibility of polysilicon with silicon processing technology. However, the relatively high electrical resistivity of polysilicon typically requires heavy doping and metallization in order to achieve acceptable performance. As the gate length is scaled down, gate resistance becomes an increasingly significant factor limiting the operating speed of integrated circuits.

Gate metallization technologies have become an increasingly important in meeting the challenges posed by shrinking gate dimensions. For example, self-aligned silicide techniques are used to provide metallization of transistor gates. However, as device dimensions continue to decrease, the silicide metallization dimensions also typically decrease. When the silicide gate metallization becomes too thin, an unacceptably high sheet resistance can result. This is further complicated by narrow-line width effects for some silicide processes.

An ideal solution is to use a highly conductive material for the gate, such as an elemental metal, that substantially lowers sheet resistance and generally eliminates the narrow-line width problems posed by some silicide techniques. Unfortunately, the substitution of part or all of a polysilicon gate with an elemental metal significantly complicates conventional semiconductor processing. For example, most suitable metals are unacceptably degraded by the chemicals and high temperatures encountered during the early stages of semiconductor device processing. This limitation generally precludes introduction of the metal as part of initial lithographic gate patterning. If the metal is introduced during later stages, a dedicated masking and lithography procedure to modify earlier patterned gates for the metal is typically required. With decreasing gate size, such a dedicated procedure is difficult to accurately align and execute.

Thus, there is a need for processing techniques which allow for efficient self-aligned processing of transistor gates.

SUMMARY OF THE INVENTION

In accordance with the preferred embodiment of the present invention, a method is presented for preparing a gate region of a transistor for receiving a deposit of metal. A chemical mechanical polishing process is performed to reduce thickness of an insulation layer above the gate region. At the end of the chemical mechanical polishing process, a portion of the insulating layer remains above the gate region. An etch process is performed to remove the portion of the insulating layer remaining above the gate region. The etch process also removes a portion of polysilicon within the gate region and removes a top portion of spacers on either side of the gate region. A polysilicon selective etch-back is performed to remove an additional portion (or all) of the polysilicon within the gate region.

In the preferred embodiment, the etch which removes the portion of the insulating layer remaining above the gate region, the portion of polysilicon within the gate region and the top portion of spacers on either side of the gate region has an oxide-to-nitride selectivity of approximately 1:1 and an oxide-to-polysilicon selectivity of approximately 1:1. For example, the etch process is performed using a $CF_4$-based plasma etch in a polysilicon etcher.

Also, in the preferred embodiment, the polysilicon selective etch-back is performed using chorine gas and Hydrogen Bromide (HBr) at a temperature of about 60 degrees Celsius. After the polysilicon selective etch-back a region remaining between the nitride spacers is, for example, refilled with a metal, which is then polished.

The method for preparing a gate region of a transistor for receiving a deposit of metal is used within the larger context of constructing a transistor. For example, in order to construct the transistor a gate oxide region is formed on a substrate. The polysilicon gate region is formed over the gate oxide region. Source/drain regions for the transistor are formed. This includes, for example, placing the spacers on either side of the polysilicon gate region. Metal silicide regions are formed over the source/drain regions. The insulating layer is formed over the source/drain regions and the polysilicon gate region.

The present invention avoids the problem of leaving filaments when the nitride spacers are filled with metal and then polished. Specifically, if the chemical mechanical polishing process is used to planarize the insulation layer to a point below the top of the spacers, a top surface of the polysilicon gate region and the nitride spacers may extend above the remaining insulating layer. After a polysilicon selective etch-back, the top of the nitride spacers remains at a height above both the remaining insulation layer and the polysilicon gate. In this case, when spacers are surrounded by metal and then polished, filaments may result. The present invention allows for this problem to be avoided.

DESCRIPTION OF THE PREFERRED EMBODIMENT

Figure 1:
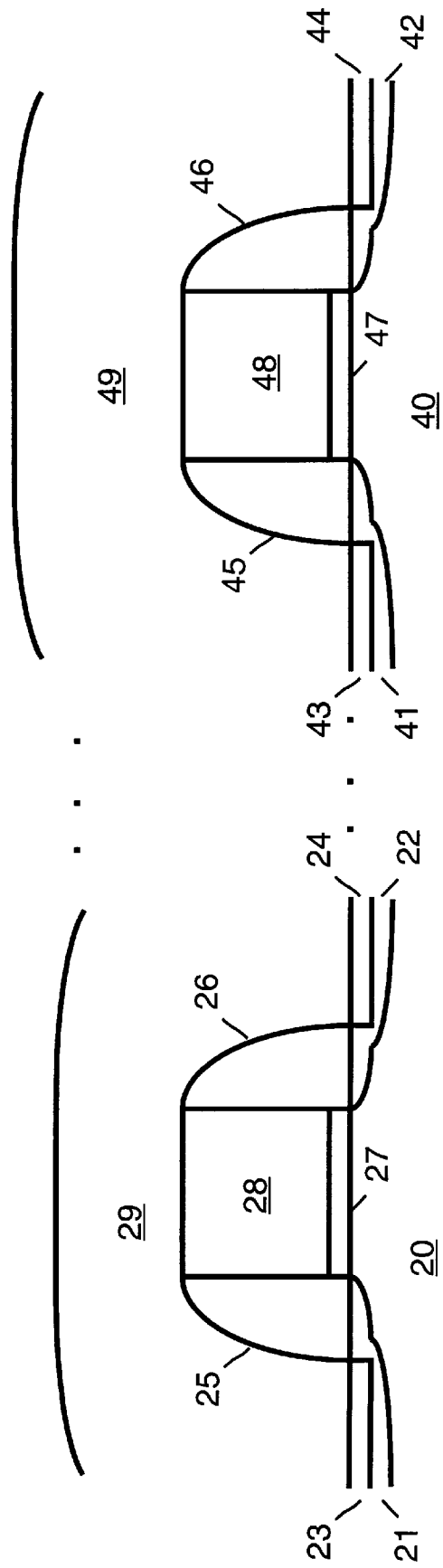
FIG. 1 shows a partial cross-sectional view of an integrated circuit at the beginning of a first self-aligned silicidation process.

In FIG. 1 shows an intermediate processing stage of an integrated circuit illustrated in cross-section. A substrate for the integrated circuit is, for example, formed from a generally planar semiconductor material such as silicon. Preferably, the substrate generally extends along a plane perpendicular to the view plane of FIG. 1. The integrated circuit can use field isolation structures to isolate discrete circuit elements. For example, the structures may be formed by a conventional shallow trench isolation process during an initial processing stage of the integrated circuit.

A first field effect transistor in an intermediate processing state includes a source/drain region 21 and a source/drain region 22 formed in a well 20. A gate region 28 is formed of polysilicon material. A spacer 25 and a spacer 26 surrounding gate region 28 are formed of nitride. Gate oxide 27 separates gate region 28 from the substrate. A metal silicide region 23 and a metal silicide region 24 are placed as shown.

Likewise, FIG. 1 also shows a second field effect transistor in an intermediate processing state includes a source/ drain region 41 and a source/drain region 42 formed in a well 40. A gate region 48 is formed of polysilicon material. A spacer 45 and a spacer 46 surrounding gate region 48 are formed of nitride. Gate oxide 47 separates gate region 48 from the substrate. A metal silicide region 43 and a metal silicide region 44 are placed as shown.

The structures shown in FIG. 1 may be formed using any conventional process. For example, CMOS front-end processing for the structures may include the establishment of corresponding n-wells and p-wells in the substrate using standard techniques. For example, the substrate may be of p-type material doped with $10^{15}$ atoms per cubic centimeter. Alternatively, the substrate may be of n-type material. A typical depth of the substrate is 500 microns. Well 20 and/or well 40 may be, for example, of p-type material doped with $10^{16}$ atoms per cubic centimeter. Alternatively, well 20 and/or well 40 may be, for example, of n-type material doped with $10^{16}$ atoms per cubic centimeter.

After well formation, a suitable gate oxide layer is formed on the substrate. For example, the thickness of the gate oxide layer is about 54 Angstroms. After formation of the gate oxide layer for the CMOS process, an amorphous silicon layer is deposited. The polysilicon gate regions (e.g., 28 and 48) are patterned from the amorphous silicon layer and silicon dioxide layer, respectively, using standard lithographic techniques. Next, a conventional Lightly Doped Drain (LDD) stage is performed and the nitride spacers are then formed.

After these stages, implantation of n+ and p+ dopant is performed, for example through a screen oxide layer. For example, n+ implantation may be accomplished by implanting ionized As at 60 keV $2\times10^{15}$ $cm^{-2}$; and p+ implantation may be accomplished by implanting ionized $BF_2$ at 50 keV $3\times10^{15}$ $cm^{-2}$. The implantation is followed, for example, by a Rapid Thermal Anneal (RTA) at about 1000 degrees Celsius for about 30 seconds to activate the implanted dopants. Front-end CMOS processing also changes the crystal lattice of the amorphous silicon layer into polysilicon.

The metal silicide regions over the source/drain regions are then formed by conventional means. For example, the gate regions are capped with a Bottom Antireflective Coating (BARC) layer. BARC layers are formed from SiON. A metallic layer is then deposited in contact with the source/drain regions. For example, the metallic layer is substantially formed from an elemental metal such as titanium (Ti), cobalt (Co), or nickel (Ni); although other materials suitable for silicidation also may be used. A first Rapid Thermal Anneal (RTA) is performed to form silicide by combining metal atoms from layer 62 with silicon in contact therewith. A silicide layer results where the metal layer and silicon from substrate 22 are in contact. Silicide layer includes silicide regions 23, 24, 43 and 44 as shown in FIG. 1. The metal layer is stripped by utilizing an etch process suitable to its composition.

For example, a Ti blanket deposited with a thickness between 20 and 40 nanometers. A first RTA is performed at 720 degrees Celsius for 30 seconds to create a silicide layer generally having a $C49$-$TiSi_2$ crystal structure. The unreacted Ti layer is then stripped using a wet etch.

An insulative or dielectric layer is then placed over the integrated circuit. The insulative layer is preferably formed from an oxide, or alternatively of nitride of silicon. The insulative layer is preferably formed with a uniform thickness greater than the maximum height of gates as they project from substrate the substrate. For example, the insulative layer is an oxide of silicon formed by a high-density plasma deposition procedure.

While it is preferable to form the insulative layer with a uniform thickness, typically the thickness can vary over an integrated circuit. This variance is represented in FIG. 1 by the thickness of oxide 29 over gate 28 being five to ten percent shallower than the thickness of oxide 49 over gate 48. The thickness of oxide 29 over gate 28 and the thickness of oxide 49 over gate 48 are meant to illustrate the extremes of variation in oxide thickness over an integrated circuit in order to best illustrate the processing steps of the preferred embodiment of the present invention.

While the above discussion gives details of CMOS processing, as will be understood by practitioners in the art, processing for other types of devices (e.g., for NMOS devices), using conventional techniques, can be used to arrive at the structure shown in FIG. 1.

Figure 2:
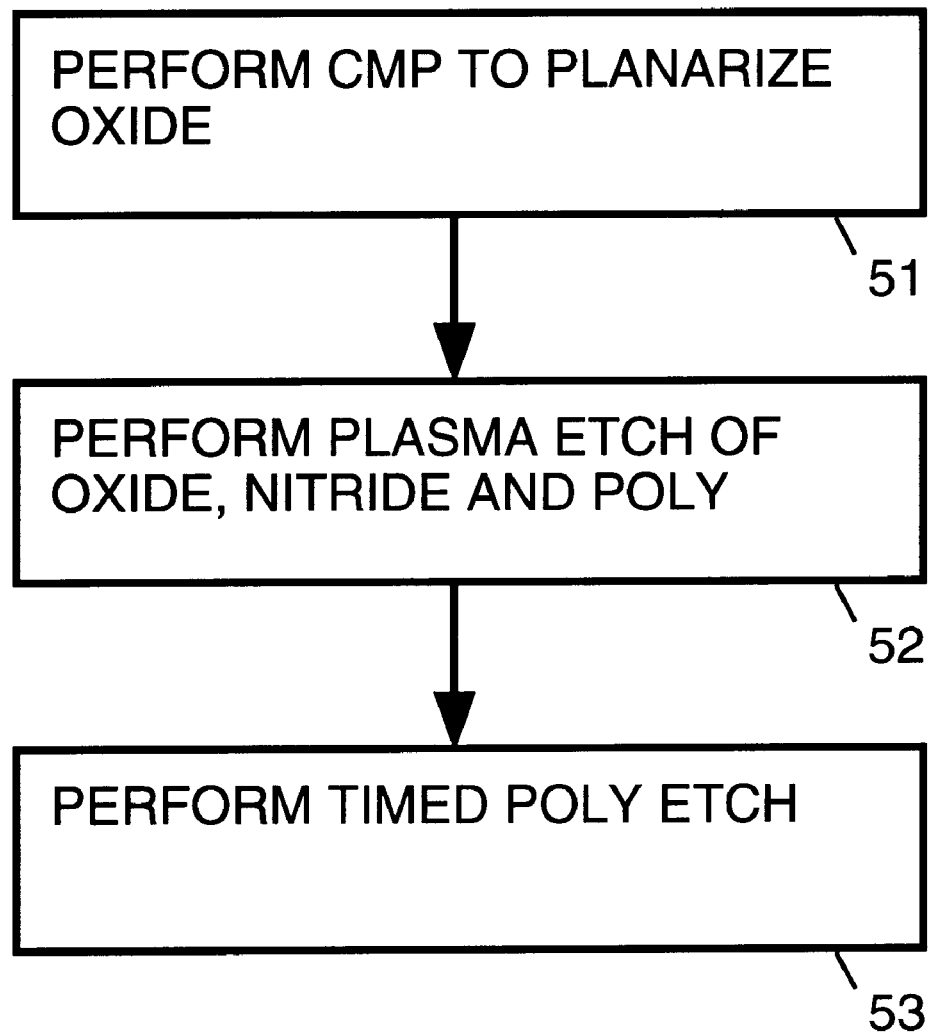
FIG. 2 is a flowchart which sets out processing steps which prepare for formation of metal gate regions, in accordance with the preferred embodiment of the present invention.

FIG. 2 is a flowchart which sets out processing steps which prepare for formation of metal gate regions. In a step 51, a chemical mechanical polishing (CMP) process is used to planarize the insulating layer. However a small amount of oxide is left over each existing gate region. This is illustrated by FIG. 3.

Figure 3:
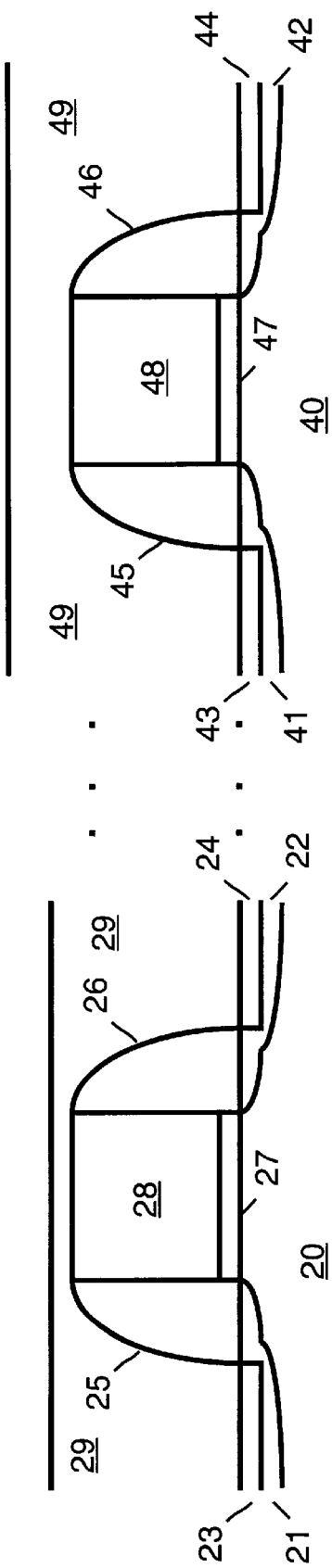
FIG. 3, FIG. 4 and FIG. 5 illustrate the steps described in the flowchart shown in FIG. 2 in accordance with the preferred embodiment of the present invention.

In FIG. 3, the thickness of oxide 29 over gate 28 has been significantly reduced; however, there still remains a portion of oxide 29 over gate 28. Likewise, the thickness of oxide 49 over gate 48 has been significantly reduced, however, there still remains a portion of oxide 49 over gate 48.

In a step 52, as set out in FIG. 2, a plasma etch is performed to etch the remaining oxide over each gate region as well as to etch part of the gate regions and nitride spacers. For example, the etch is performed using a $CF_4$-based plasma etch in a polysilicon etcher. The etch is performed with an oxide-to-nitride selectivity of approximately 1:1 and with an oxide-to-polysilicon selectivity of approximately 1:1. The etch is performed until an optical emission signals an endpoint. The endpoint occurs at a point where there is no oxide remaining over a gate region. This is illustrated by FIG. 4.

Figure 4:
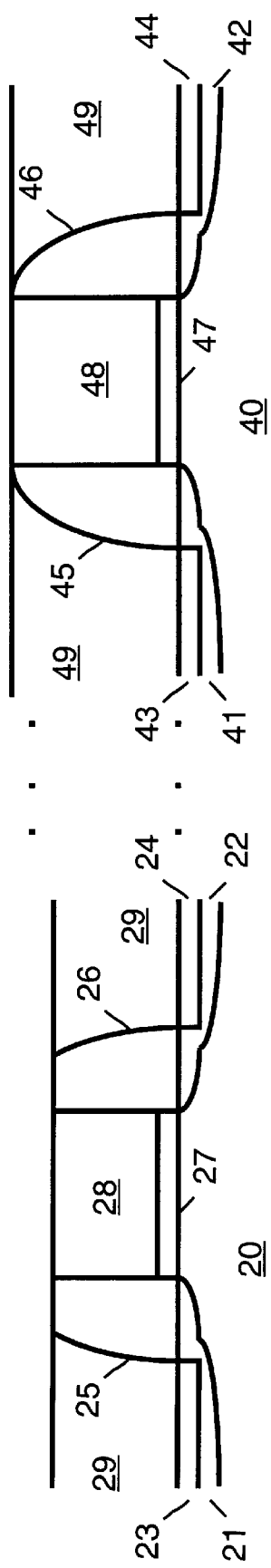

In FIG. 4, all of oxide 29 directly over gate 28 has been etched away. In addition, a portion of polysilicon within gate region 28, as well as a portion of nitride spacers 25 and 26 have been etched away. Likewise, all of oxide 49 directly over gate 48 has been etched away. In addition, a portion of polysilicon within gate region 48, as well as a portion of nitride spacers 45 and 46 may be etched away, depending upon the endpoint of the etch.

In a step 53, as set out in FIG. 2, a timed polysilicon selective etch-back is used to remove a controlled amount of each polysilicon gate, in preparation for refilling to make the gate a metal gate. In one preferred embodiment, polysilicon selective etch-back chemistry includes chorine gas and Hydrogen Bromide (HBr) at a temperature of about 60 degrees Celsius; however, other etching chemistries or removal techniques may be employed. The result of step 53 is illustrated by FIG. 5.

Figure 5:
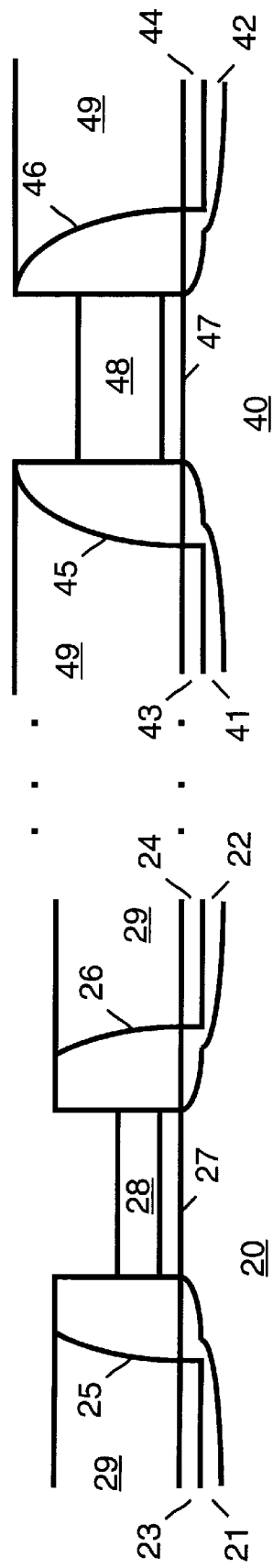

In FIG. 5, a portion of the polysilicon forming gate 28 has been etched away. Likewise, a portion of the polysilicon forming gate 48 has been etched away. While the polysilicon forming gate 28 is thinner than the polysilicon forming gate 48, the gate region between spacers 25 and 26 is easily refilled with metal and polished without leaving filaments.

Processing can continue in a conventional manner. For example, after a controlled etch-back of the gates, a pattern of photoresist can be provided using conventional lithography techniques. The pattern defines openings for subsequent processing. Recesses and/or trenches are formed to expose the source/drain connection regions (e.g., regions 23, 34, 43 and 44) A local interconnect layer (e.g., of tungsten (W)) is deposited to fill the recesses and trenches. The interconnect layer is planarized, for example, by a suitable CMP process or etch-back technique to provide a generally planar surface with various metallic fill regions that are electrically conductive. An intermetal oxide (IMO) layer can then be deposited on the surface. Metallic contact via holes with metal plugs can be used to provide electrical contact with electrodes. The simultaneous and selective formation of gate electrodes and local interconnections facilitates the development of high density devices such as random access memory (RAM). Furthermore, this metallization technique may be applied to a variety of semiconductors device types and arrangements, reducing the need for gate to source/drain interconnects through an upper insulative or dielectric layer by contact metal.

For additional background information on self-aligned processing to modify the gate of a field effect transistor, see copending patent Ser. No. 08/886,170, filed Jun. 30, 1997 filed on Jun. 30, 1997 by Xi-Wei Lin for SELF-ALIGNED PROCESSING OF SEMICONDUCTOR DEVICE FEATURES, which is hereby incorporated by reference.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for preparing a gate region of a transistor for receiving a deposit of metal, the method comprising the following steps:

(a) performing a chemical mechanical polishing process to planarize and reduce thickness of an insulation layer above the gate region, at the end of the chemical mechanical polishing process, a portion of the insulating layer remaining above the gate region;

(b) performing an etch process, the etch process removing the portion of the insulating layer remaining above the gate region, the etch process also removing a portion of polysilicon within the gate region and the etch process also removing a top portion of spacers on either side of the gate region; and, (c) performing a polysilicon selective etch-back to an additional portion of the polysilicon within the gate region.

2. A method as in claim 1 wherein in step (b) the etch process has an oxide-to-nitride selectivity of approximately 1:1 and with an oxide-to-polysilicon selectivity of approximately 1:1.

3. A method as in claim 1 wherein in step (b) the etch process is performed using a $CF_4$-based plasma etch in a polysilicon etcher.

4. A method as in claim 1 wherein in step (c) the polysilicon selective etch-back is performed using chorine gas and Hydrogen Bromide (HBr) at a temperature of about 60 degrees Celsius.

5. A method as in claim 1 additionally comprising the following step:

(d) refilling a region remaining between the spacers with a metal.

6. A method as in claim 5 additionally comprising the following step:

(e) polishing the metal.

7. A method as in claim 1 wherein in step (c) the additional portion of the polysilicon is all the polysilicon within the gate region.

8. A method for achieving a planar surface in preparation of a gate region of a transistor for receiving a deposit of metal, the method comprising the following steps:

(a) performing a chemical mechanical polishing process to reduce thickness of an insulation layer above the gate region, at the end of the chemical mechanical polishing process, a portion of the insulating layer remaining above the gate region; and, (b) performing an etch process, the etch process removing the portion of the insulating layer remaining above the gate region, the etch process also removing a portion of polysilicon within the gate region and the etch process also removing a top portion of spacers on either side of the gate region.

9. A method for constructing a transistor comprising the following steps:

(a) forming a gate oxide region on a substrate;

(b) forming a polysilicon gate region over the gate oxide region;

(c) forming source/drain regions for the transistor, including the following substep:

(c.1) placing spacers on either side of the polysilicon gate region;

(d) placing an insulating layer over the source/drain regions and the polysilicon gate region;

(e) performing a chemical mechanical polishing process to reduce thickness of the insulation layer, at the end of the chemical mechanical polishing process, a portion of the insulating layer remaining above the gate region; and, (f) performing an etch process, the etch process removing the portion of the insulating layer remaining above the gate region, the etch process also removing a portion of polysilicon within the gate region and the etch process also removing a top portion of the spacers on either side of the gate region.

10. A method as in claim 9 additionally comprising the following step:

(g) performing a polysilicon selective etch-back to remove an additional portion of the polysilicon within the gate region.

11. A method as in claim 10 additionally comprising the following step:

(h) refilling a region remaining between the spacers with a metal.

12. A method as in claim 11 additionally comprising the following step:

(i) polishing the metal.

13. A method as in claim 10 wherein in step (g) the polysilicon selective etch-back is performed using chorine gas and Hydrogen Bromide (HBr) at a temperature of about 60 degrees Celsius.

14. A method as in claim 9 wherein in step (f) the etch process has an oxide-to-polysilicon selectivity of approximately 1:1.

15. A method as in claim 10 wherein in step (f) the etch process is performed using a $CF_4$-based plasma etch in a polysilicon etcher.

16. A method as in claim 9 additionally comprising the following step performed after step (c):

forming metal silicide regions over the source/drain regions.

17. A method as in claim 9 wherein in step (f) the portion of polysilicon within the gate region is all the polysilicon within the gate region.

* * * * *